(12) United States Patent
Wang et al.

(10) Patent No.: US 11,029,546 B2
(45) Date of Patent: Jun. 8, 2021

(54) FLEXIBLE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Haifeng Wang, Wuhan (CN); Shoucheng Wang, Wuhan (CN); Kun Pan, Wuhan (CN)

( * ) Notice: Subject to any disclaimer, the term of this patent is extended or adjusted under 35 U.S.C. 154(b) by 329 days.

(21) Appl. No.: 16/332,795

(22) PCT Filed: Jan. 24, 2019

(86) PCT No.: PCT/CN2019/072902
§ 371 (c)(1),
(2) Date: Mar. 13, 2019

(87) PCT Pub. No.: WO2020/124740
PCT Pub. Date: Jun. 25, 2020

(65) Prior Publication Data
US 2021/0124197 A1    Apr. 29, 2021

(30) Foreign Application Priority Data
Dec. 17, 2018  (CN) .......................... 201811544572.0

(51) Int. Cl.
*G02F 1/133*    (2006.01)
*G02F 1/1333*   (2006.01)
*H01L 23/498*   (2006.01)

(52) U.S. Cl.
CPC .... *G02F 1/13306* (2013.01); *G02F 1/133305* (2013.01); *G02F 1/133385* (2013.01); *H01L 23/4985* (2013.01)

(58) Field of Classification Search
None
See application file for complete search history.

(56) References Cited

U.S. PATENT DOCUMENTS

2010/0110328 A1    5/2010   Tatebayashi et al.
2014/0307396 A1*  10/2014   Lee ....................... H05K 1/028
                                                        361/749

(Continued)

FOREIGN PATENT DOCUMENTS

CN        102809841 A    12/2012
CN        104300089 A     1/2015
(Continued)

*Primary Examiner* — Richard H Kim

(57) ABSTRACT

A flexible display device is provided. The flexible display device includes a flexible panel including a non-bendable area, a bendable area and a plane area; a heat emission support layer positioned between the non-bendable area and the plane area, at least one groove defined in a surface of the heat emission support layer towards the plane area; a chip on film (COF), a side of the COF is connected to the plane area, a driving element positioned on a surface of the COF towards the heat emission support layer; a circuit board, a side of the circuit board is connected to the COF, another side of the circuit board is connected to the heat emission support layer, and a circuit board element positioned on a surface of the circuit board towards the heat emission support layer. the driving element and the circuit board element are positioned within the groove.

10 Claims, 3 Drawing Sheets

(56) References Cited

U.S. PATENT DOCUMENTS

2015/0021570 A1    1/2015   Kim et al.
2015/0153607 A1    6/2015   Chen et al.
2019/0393433 A1   12/2019   Dagn et al.

FOREIGN PATENT DOCUMENTS

CN      108573656 A    9/2018
JP       2009008810 A    1/2009

\* cited by examiner

FLEXIBLE DISPLAY DEVICE

FIELD OF INVENTION

The present disclosure relates to the field of liquid crystal display technologies, and more particularly to a flexible display device.

BACKGROUND OF INVENTION

Among flat panel display devices, a liquid crystal display (LCD) has the characteristics of small volume, low power consumption, relatively low manufacturing cost and radiation-free, whereby LCDs currently dominate the flat panel display device market.

A chip on film (COF) is a driving element used in LCDs, and the COF is usually bonded to an edge of a liquid crystal panel by hot pressing. With the development of display technologies, display products with narrow bezel have attracted a large quantity of consumers because they provide consumers with pleasant viewing experience. To obtain a LCD with a narrow bezel, the COF is usually bent from a front side of the liquid crystal panel to a backside of a backlight module to decrease a space in a side of the bezel that may be occupied by the COF.

In existing technologies, after the COF is bent to the backside of the backlight module, driving chips on the COF are located close to the backlight module. When the LCD is working, the driving chips can produce a large amount of heat, and the backlight module can produce a large amount of heat at the same time. Because the driving chips are located close to the backlight module, a distance between the driving chips and the backlight module is very small, and heat radiation produced from the backlight module adds with heat radiation produced from the COFs, which causes the temperature of the driving chips to be quite high. The driving chips are important parts which transmit and process signals; excessively high temperature of the driving chips can have an impact on their working stability, which lowers the reliability of the driving chips and even damages the driving chips due to the overheating.

SUMMARY OF INVENTION

An object of the present disclosure is to provide a flexible display device, a driving element and a circuit board element are embedded within materials by changing relative positions of the driving element and the circuit board to a flexible panel and combining the scheme that a groove is defined in a heat emission support layer to solve the problem that the flexible display device is too thick in existing technologies.

To achieve the above object, an embodiment of the present disclosure provides a flexible display device. The flexible display device includes a flexible panel including a non-bendable area, a bendable area adjacent to the non-bendable area and a plane area which is adjacent to the bendable area and which is parallel to the non-bendable area; a heat emission support layer positioned between the non-bendable area and the plane area, at least one groove is defined in a side of the heat emission support layer towards the plane area; a chip on film (COF), a side of the COF is connected to the plane area, and a driving element is provided on a surface of the COF towards the heat emission support layer; a circuit board, a side of the circuit board is connected to the COF and another side of the circuit board is connected to the heat emission support layer, and a circuit board element is provided on the surface of the circuit board towards the heat emission support layer. The driving element and the circuit board element are correspondingly positioned within the at least one groove.

In an embodiment of the present disclosure, the groove includes a first groove corresponding to the circuit board and a second groove corresponding to the COF, the circuit board element is positioned within the first groove, and the driving element is positioned within the second groove.

In an embodiment of the present disclosure, an overlapping segment is formed between the circuit board and the COF, and the first groove and the second groove divide the heat emission support layer into a first support segment corresponding to a side of the circuit board, a second support segment corresponding to the overlapping segment between the circuit board and the COF and a third support segment corresponding to the plane area.

In an embodiment of the present disclosure, the flexible display device further includes a third support component positioned between the third support segment and the plane area, a second support component positioned between the second support segment and the overlapping segment, and a first support component positioned between the first support segment and the circuit board.

In an embodiment of the present disclosure, the flexible display device further includes a first guard board positioned between the non-bendable area and the heat emission support layer and a second guard board positioned between the third support component and the plane area.

In an embodiment of the present disclosure, the heat emission support layer includes a foaming layer positioned at a side close to the non-bendable area, a heat emission layer positioned at a side close to the plane area and a graphite layer positioned between the foaming layer and the heat emission layer.

In an embodiment of the present disclosure, the groove runs through the heat emission layer and the graphite layer, or the groove runs through the heat emission layer, the foaming layer and the graphite layer.

In an embodiment of the present disclosure, the heat emission layer is made of copper foil.

In an embodiment of the present disclosure, the flexible display device further includes an anisotropic conductive adhesive film, and the anisotropic conductive adhesive film is utilized to connect the COF to the plane area and connect the COF to the circuit board.

In an embodiment of the present disclosure, a heat emission film covers an inner wall of the groove.

The embodiment of the present disclosure provides the flexible display device. The driving element and the circuit board element are embedded within the heat emission support layer by changing relative position of the driving element and the circuit board to the flexible panel and combining a groove defined in the heat emission support layer to thin the flexible display device.

DESCRIPTION OF DRAWINGS

Hereinafter, the accompanying figures to be used in the description of embodiments of the present disclosure will be described in brief to more clearly illustrate the technical solutions of the present disclosure. Obviously, the accompanying figures described below are only part of the embodiments of the present disclosure, from which figures those skilled in the art can derive further figures without making any inventive efforts.

Figure 1:
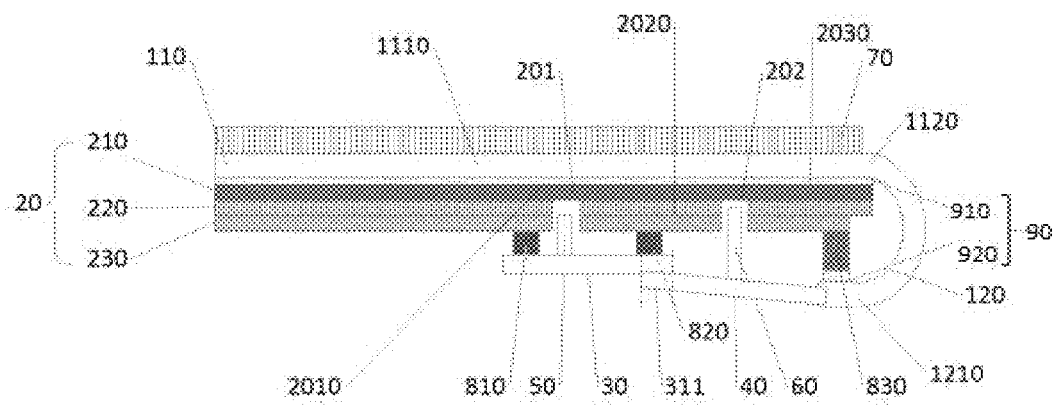
FIG. 1 is a schematic diagram of a flexible display device according to a first embodiment.

Components in the drawings are marked as below:

10 flexible panel; 20 heat emission support layer; 201 first groove; 202 second groove; 203 third groove; 204 fourth groove; 205 fifth groove; 210 foaming layer; 220 graphite layer; 230 heat emission layer; 30 circuit board; 310 anisotropic conductive film; 311 overlapping segment; 40 chip on film; 50 circuit board element; 60 driving element; 70 polarizer; 810 first support component; 820 second support component; 830 third support component; 840 fourth support component; 850 fifth support component; 2010 first support segment; 2020 second support segment; 2030 third support segment; 2040 fourth support segment; 2050 fifth support segment; 90 guard board; 910 first guard board; 920 second guard board; 110 non-bendable area; 1110 display area; 1120 non-display area; 120 bendable area; 1210 plane area; 231 heat emission film;

DETAILED DESCRIPTION OF PREFERRED EMBODIMENTS

First Embodiment

As shown in FIG. 1, in the first embodiment, a flexible display device of the present disclosure includes a flexible panel 10, a heat emission support layer 20, a circuit board 30, a chip on film (COF) 40, a circuit board element 50, a driving element 60, a polarizer 70, a first support component 810, a second support component 820, a third support component 830 and a guard board 90.

Figure 2:
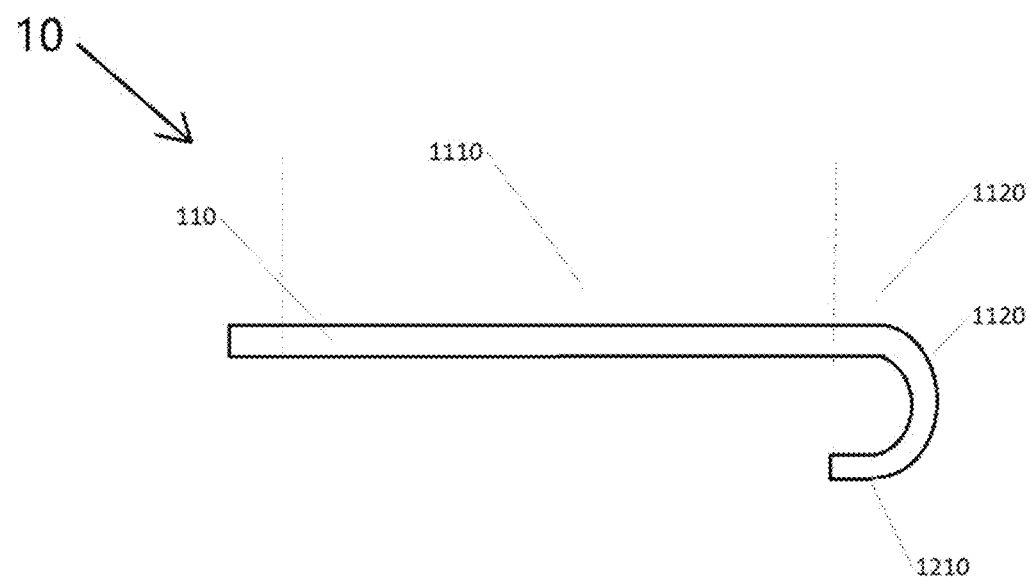
FIG. 2 is a schematic diagram of a flexible panel of the flexible display device in the first embodiment.

As shown in FIG. 2, the flexible panel 10 is a flexible film substrate made of plastics or metallic foils, wherein the flexible panel 10 includes a non-bendable area 110 and a bendable area 120 adjacent to the non-bendable area 110. The non-bendable area 110 includes a display area 1110 and a non-display area 1120. The polarizer 70 covers the display area 1110. The bendable area 120 bends and extends from a side of the non-display area 1120 to a side of the heat emission support layer 20 away from the flexible panel 10 and forms a plane area 1210.

The heat emission support layer 20 includes a foaming layer 210, a graphite layer 220 and a heat emission layer 230 made of copper foil, wherein the foaming layer 210 is positioned at a surface of the non-bendable area 110 away from the display area 1110 so as to support the flexible panel 10 and dissipate the heat of the flexible panel 10. Meanwhile, to thin the flexible display device, in the first embodiment, a first groove 201 and a second groove 202 are defined in the heat emission support layer 20, wherein the first groove 201 and the second groove 202 divide the heat emission support layer 20 into three segments. The three segments of the heat emission support layer 20 include a first support segment 2010 corresponding to a side of the circuit board 30, a second support segment 2020 corresponding to an overlapping segment 311 formed by connecting the circuit board 30 to the COF 40 with an anisotropic conductive film 310 and a third support segment 2030 corresponding to the plane area 1210.

The first groove 201 and the second groove 202 are utilized to accommodate the driving element 60 and the circuit board element 50. Specifically, actual groove depths and sizes of the first groove 201 and the second groove 202 depend on sizes of the driving element 60 and the circuit board element 50, for example, the driving element 60 which has a length, a width and a thickness of 33 mm, 1.8 mm and 0.2 mm, respectively. Considering the accuracy of the bendable area 120 and the adhesion accuracy between the first support component 810 and the circuit board 30, a length and a width of the second groove 202 corresponding to the driving element 60 are 33.3 mm and 2.1 mm, respectively, and the size of the first groove 201 depends on sizes of the circuit board element 50.

In the first embodiment, the thickness of the driving element 60 is 0.2 mm, and a total thickness of the foaming layer 210, the graphite layer 220 and the heat emission layer 230 is greater than 0.2 mm, so that the first groove 201 and the second groove 202 are defined in one layer or two layers selected from the foaming layer 210, the graphite layer 220 and the heat emission layer 230. In the first embodiment, the first groove 201 and the second groove 202 are defined in the graphite layer 220 and the heat emission layer 230.

The first support component 810 supports the circuit board 30 and the first support segment 2010, the second support component 820 supports the overlapping segment 311 and the second support segment 2020, and the third support component 830 supports the COF 40 and the third support segment 2030. Heights of the driving element 60 and the circuit board element 50 positioned within the second groove 202 and the first groove 201 are controlled by adjusting heights of the first support component 810 and the second support component 820. The third support component 830 is used to adjust a bending curvature of the bendable area 120.

The circuit board element 50 is soldered to a surface of the circuit board 30 facing the heat emission support layer 20 and is electrically connected to the circuit board 30. The circuit board element 50 is positioned between the first groove 201 and the circuit board 30.

A side of the COF 40 far away from the overlapping segment 311 is electrically connected to the plane area 1210 with the anisotropic conductive film 310.

The driving element 60 is soldered to a surface of the COF 40 facing the heat emission support layer 20 and is electrically connected to the COF 40. The driving element 60 is positioned between the second groove 202 and the COF 40.

The guard board 90 includes a first guard board 910 and a second guard board 920. The first guard board 910 is positioned between the heat emission support layer 20 and the flexible panel 10 to support the flexible panel 10. The second guard board 920 is positioned between the plane area 1210 and the third support component 830. The function of the second guard board 920 is similar to that of the third support component 830. The second guard board 920 and the third support component 830 are both used to adjust the bending curvature of the bendable area 120.

Second Embodiment

Figure 3:
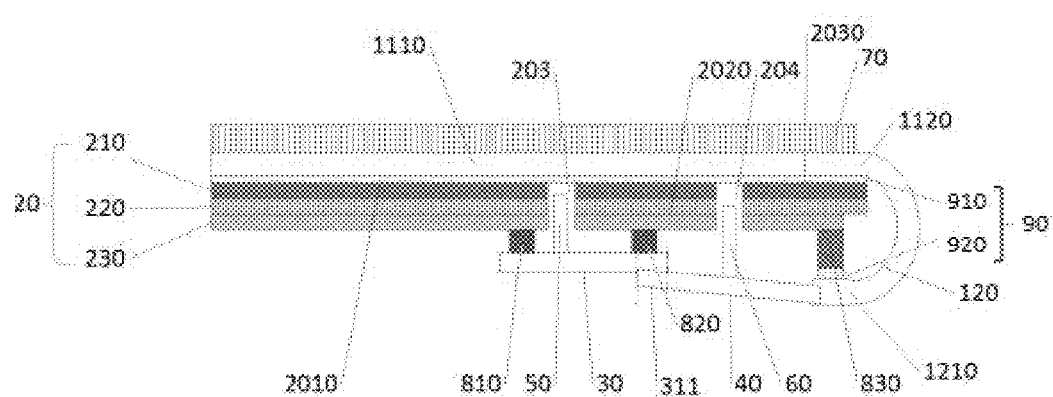
FIG. 3 is a schematic diagram of a flexible display device according to a second embodiment.

As shown in FIG. 3, in the second embodiment, a flexible display device of the present disclosure includes a flexible panel 10, a heat emission support layer 20, a circuit board 30, a chip film (COF) 40, a circuit board element 50, a driving element 60, a polarizer 70, a first support component 810, a second support component 820, a third support component 830 and a guard board 90.

The flexible panel 10 is a flexible film substrate made of plastics or metallic foils, wherein the flexible panel 10 includes a non-bendable area 110 and a bendable area 120, the non-bendable area 110 includes a display area 1110 and a non-display area 1120. The polarizer 70 covers the display area 1110. The bendable area 120 bends and extends from a side of the non-display area 1120 to a side of the heat emission support layer 20 away from the flexible panel 10, and forms a plane area 1210.

The heat emission support layer 20 includes a foaming layer 210, a graphite layer 220 and a heat emission layer 230, wherein the foaming layer 210 is positioned at a surface of the non-bendable area 110 away from the display area 1110 so as to support the flexible panel 10 and dissipate the heat of the flexible panel 10. To thin the flexible display device, in the second embodiment, a third groove 203 and a fourth groove 204 are defined in the heat emission support layer 20.

Thereinto, the third groove 203 and the fourth groove 204 divide the heat emission support layer 20 into three segments. The three segments of the heat emission support layer 20 include a first support segment 2010 corresponding to a side of the circuit board 30, a second support segment 2020 corresponding to an overlapping segment 311 formed by connecting the circuit board 30 to the COF 40 with an anisotropic conductive film 310 and a third support segment 2030 corresponding to the plane area 1210.

The third groove 203 and the fourth groove 204 are utilized to accommodate the driving element 60 and the circuit board element 50. Specifically, actual groove depths and sizes of the third groove 203 and the fourth groove 204 depend on sizes of the driving element 60 and the circuit board element 50, for example, the driving element 60 which has a length, a width and a thickness of 33 mm, 1.8 mm and 0.2 mm, respectively. Considering the accuracy of the bendable area 120 and the adhesion accuracy between the first support component 810 and the circuit board 30, a length and a width of the groove defined in the foaming layer 210, the graphite layer 220 and the heat emission layer 230 are 33.3 mm and 2.1 mm, respectively.

In the second embodiment, the thickness of the driving element 60 is 0.2 mm, and a total thickness of the foaming layer 210, the graphite layer 220 and the heat emission layer 230 is less than 0.2 mm, so that it is necessary to combine heights of the first support component 810, the second support component 820 and the third support component 830 (a thickness of the third support component 830 in actual production is about 0.55 mm), and make a choice that the third groove 203 and the fourth groove 204 both run through the heat emission support layer 20.

The first support component 810 supports the circuit board 30 and the first support segment 2010, the second support component 820 supports the overlapping segment 311 and the second support segment 2020, and the third support component 830 supports the COF 40 and the third support segment 2030. Heights of the driving element 60 and the circuit board element 50 positioned within the fourth groove 204 and the third groove 203 are controlled by adjusting heights of the first support component 810 and the second support component 820. The third support component 830 is used to adjust a bending curvature of the bendable area 120.

The circuit board element 50 is soldered to a surface of the circuit board 30 facing the heat emission support layer 20 and is electrically connected to the circuit board 30. The circuit board element 50 is positioned between the third groove 203 and the circuit board 30.

A side of the COF 40 far away from the overlapping segment 311 is connected to the plane area 1210 with the anisotropic conductive film 310.

The driving element 60 is soldered to a surface of the COF 40 facing the heat emission support layer 20 and is electrically connected to the COF 40. The driving element 60 is positioned between the fourth groove 204 and the COF 40.

The guard board 90 includes a first guard board 910 and a second guard board 920. The first guard board 910 is positioned between the heat emission support layer 20 and the flexible panel 10 to support the flexible panel 10. The second guard board 920 is positioned between the plane area 1210 and the third support component 830. The function of the second guard board 920 is similar to that of the third support component 830. The second guard board 920 and the third support component 830 are both used to adjust the bending curvature of the bendable area 120.

Figure 4:
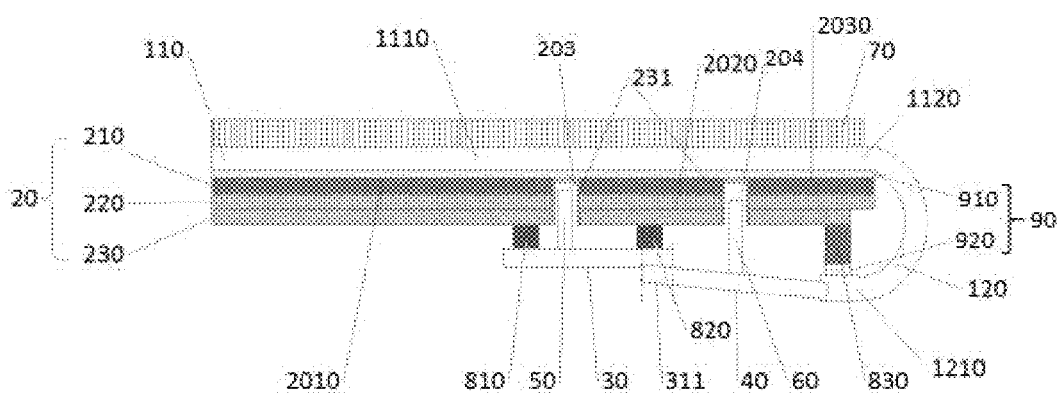
FIG. 4 is another schematic diagram of a flexible display device according to a second embodiment.

As shown in FIG. 4, considering the heat emission problem of the circuit board element 50 and the driving element 60, a heat emission film 231 is attached within the third groove 203 and the fourth groove 204. The heat emission film 231 is made of copper foil.

Third Embodiment

Figure 5:
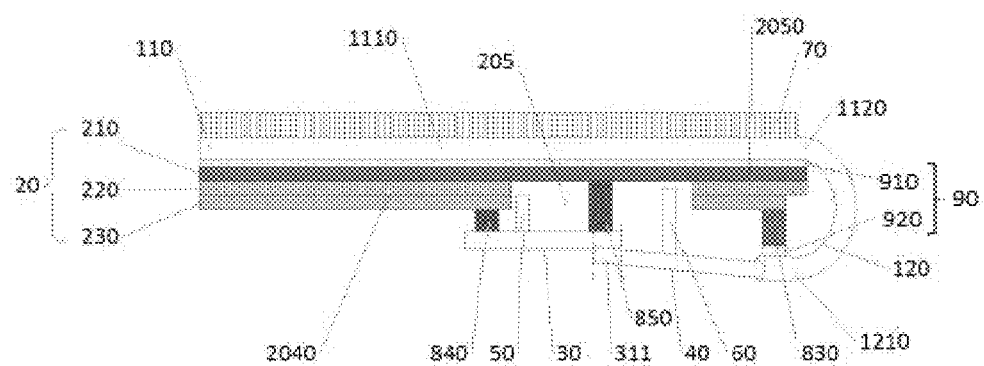
FIG. 5 is a schematic diagram of a flexible display device according to a third embodiment.

As shown in FIG. 5, in the third embodiment, a flexible display device of the present disclosure includes a flexible panel 10, a heat emission support layer 20, a circuit board 30, a chip on film 40 (COF), a circuit board element 50, a driving element 60, a polarizer 70, a fourth support component 840, a fifth support component 850 and a third support component 830 and a guard board 90.

The flexible panel 10 is a flexible film substrate made of plastics or metallic foils, wherein the flexible panel 10 includes a non-bendable area 110 and a bendable area 120. The non-bendable area 110 includes a display area 1110 and a non-display area 1120. The polarizer 70 covers the display area 1110. The bendable area 120 bends and extends from a side of the non-display area 1120 to a side of the heat emission support layer 20 away from the flexible panel 10, and forms a plane area 1210.

The heat emission support layer 20 includes a foaming layer 210, a graphite layer 220 and a heat emission layer 230, wherein the foaming layer 210 is positioned on a surface of the non-bendable area 110 away from the display area 1110 to support the flexible panel 10 and dissipate the heat of the flexible panel 10. Meanwhile, to thin the flexible display device, in the third embodiment, a fifth groove 205 is defined in the heat emission support layer 20.

The fifth groove 205 divide the heat emission support layer 20 into two segments. The two segments of heat emission support layer 20 includes a fourth support segment 2040 corresponding to a side of the circuit board 30 and a fifth support segment 2050 corresponding to the plane area 1210.

The fifth groove 205 is utilized to accommodate the driving element 60 and the circuit board element 50. The fifth groove 205 is at the backside of the flexible panel 10. The driving element 60 and the circuit board element 50 are positioned within the fifth groove 205.

The fourth support component 840 supports the circuit board 30 and the fourth support segment 2040, the fifth support component 850 supports the overlapping segment 311 and the fifth groove 205.

Figure 6:
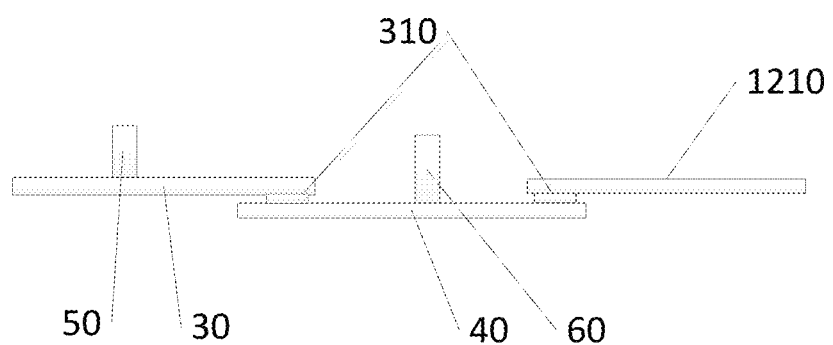
FIG. 6 is a partially schematic diagram of the flexible display device according to the third embodiment.

As shown in FIG. 6, the circuit board element 50 is soldered to a surface of the circuit board 30 facing the heat emission support layer 20 and is electrically connected to the circuit board 30. A side of the COF 40 is connected to the circuit board 30 by an anisotropic conductive film 310, and another side of the COF 40 is connected to the plane area 1210 by the anisotropic conductive film 310.

The driving element 60 is soldered to a surface of the COF 40 facing the heat emission support layer 20 and is electrically connected to the COF 40.

The guard board 90 includes a first guard board 910 and a second guard board 920. The first guard board 910 is positioned between the heat emission support layer 20 and the flexible panel 10 to support the flexible panel 10. The second guard board 920 is positioned between the bendable area 120 and the third support component 830. The function of the second guard board 920 is similar to that of the third support component 830. The second guard board 920 and the third support component 830 are both used to adjust the bending curvature of the bendable area 120.

The present disclosure has been described with a preferred embodiment thereof, the preferred embodiment is not intended to limit the present disclosure. Many modifications, equivalent replacements and improvements to the described embodiment without departing from the scope and the spirit of the disclosure are included in the protection scope of the present disclosure.

The invention claimed is:

1. A flexible display device, comprising:
a flexible panel comprising a non-bendable area, a bendable area adjacent to the non-bendable area and a plane area which is adjacent to the bendable area and which is parallel to the non-bendable area;
a heat emission support layer positioned between the non-bendable area and the plane area, wherein at least one groove is defined in a side of the heat emission support layer towards the plane area;
a chip on film (COF), wherein a side of the COF is connected to the plane area, and a driving element is provided on a surface of the COF towards the heat emission support layer; and
a circuit board, wherein a side of the circuit board is connected to the COF and another side of the circuit board is connected to the heat emission support layer, and a circuit board element is provided on the surface of the circuit board towards the heat emission support layer;
wherein the driving element and the circuit board element are positioned within the at least one groove.

2. The flexible display device according to claim 1, wherein the groove comprises a first groove corresponding to the circuit board and a second groove corresponding to the COF, the circuit board element is positioned within the first groove, and the driving element is positioned within the second groove.

3. The flexible display device according to claim 2, wherein an overlapping segment is formed between the circuit board and the COF, and the first groove and the second groove divide the heat emission support layer into a first support segment corresponding to a side of the circuit board, a second support segment corresponding to the overlapping segment between the circuit board and the COF and a third support segment corresponding to the plane area.

4. The flexible display device according to claim 3, wherein the flexible display device further comprises a third support component positioned between the third support segment and the plane area, a second support component positioned between the second support segment and the overlapping segment, and a first support component positioned between the first support segment and the circuit board.

5. The flexible display device according to claim 4, wherein the flexible display device further comprises a first guard board positioned between the non-bendable area and the heat emission support layer and a second guard board positioned between the third support component and the plane area.

6. The flexible display device according to claim 5, wherein the heat emission support layer comprises a foaming layer positioned at a side close to the non-bendable area, a heat emission layer positioned at a side close to the plane area and a graphite layer positioned between the foaming layer and the heat emission layer.

7. The flexible display device according to claim 6, wherein the groove runs through the heat emission layer and the graphite layer, or the groove runs through the heat emission layer, the foaming layer and the graphite layer.

8. The flexible display device according to claim 6, wherein the heat emission layer is made of copper foil.

9. The flexible display device according to claim 1, wherein the flexible display device further comprises an anisotropic conductive adhesive film, and the anisotropic conductive adhesive film is utilized to connect the COF to the plane area and connect the COF to the circuit board.

10. The flexible display device according to claim 1, wherein a heat emission film covers an inner wall of the groove.

* * * * *